(12) United States Patent
Chiou et al.

(10) Patent No.: US 6,515,366 B1
(45) Date of Patent: Feb. 4, 2003

(54) REDUCTION OF METAL CORROSION IN SEMICONDUCTOR DEVICES

(75) Inventors: Wen-Chih Chiou, Miaoli (TW); Tsu Shih, Hsin-Chu (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 10/077,071

(22) Filed: Feb. 14, 2002

(51) Int. Cl.[7] ............................................. H01L 29/80
(52) U.S. Cl. ..................... 257/758; 257/784; 257/786; 257/762; 438/622; 438/687
(58) Field of Search ................................. 257/758, 780, 257/781, 784, 786, 750, 762; 438/622, 625, 959, 687

(56) References Cited

U.S. PATENT DOCUMENTS 6,225,697 B1 * 5/2001 Igushi 6,306,751 B1 * 10/2001 Patel

* cited by examiner

Primary Examiner—Sheila V. Clark
(74) Attorney, Agent, or Firm—Tung & Associates

(57) ABSTRACT

Reducing metal corrosion, such as copper corrosion, in semiconductor devices, is disclosed. A semiconductor device includes an insulating layer, a metal line, one or more corrosive metal components, and one or more sacrificial corrosive metal components. The metal line is situated within the insulating layer. The one or more corrosive metal components are situated within the insulating layer and connected to the metal line. The one or more sacrificial corrosive metal components are situated within the insulating layer and connected to the metal line. The presence of the sacrificial components substantially reduces corrosion of the non-sacrificial components.

18 Claims, 3 Drawing Sheets

REDUCTION OF METAL CORROSION IN SEMICONDUCTOR DEVICES

FIELD OF THE INVENTION

This invention relates generally to semiconductor devices that employ corrosive metal, such as copper, and more particularly to the corrosion that results when using corrosive metal such as copper in semiconductor devices.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Semiconductor devices have traditionally been externally and internally wired by aluminum. The semiconductor industry has used aluminum wiring on chips for over thirty years. But the ever-shrinking universe of semiconductors has made aluminum more and more problematic, since it resists the flow of electricity as wires are made ever thinner and narrower. Therefore, semiconductor designers have tried to use alternative metals to aluminum. One such metal is copper. Copper is a superior conductor of electricity, making it possible to shrink the electronic devices even further while further increasing performance. But copper poses problems.

One such problem is corrosion. Corrosion of semiconductor device copper connections and interconnects can cause chip failure. Corrosion can increase the resistance of these connections and interconnections, nullifying copper's inherent lower resistance and thus one of the advantages of using copper in semiconductors. Furthermore, corrosion can cause a semiconductor device to malfunction. The copper contacts may corrode together, causing shorts. Corrosion can also cause rapid thickness loss of the copper being corroded. Copper corrosion occurs especially during chemical-mechanical polishing (CMP). This is particularly problematic, because CMP is used to expose metal contacts for subsequent connecting. Where the metal contacts are copper, this means that corrosion and its deleterious effects may occur during CMP.

FIGS. 1 and 2 show an example of the corrosion process with respect to an illustrative connection of a semiconductor device 100. FIG. 1 shows a cross-sectional side view of the device 100, whereas FIG. 2 shows a top view of the device 100. An insulating layer 102, which can be fluorinated silicate glass (FSG), is impregnated with a line of copper 104, which rises up to form a via, a pad, or a contact 108. As a result of time, or certain semiconductor fabrication processes such as CMP, electrons, as represented by the arrows 106, migrate towards the contact 108. This results in the corrosion 110, because current flows from the line of copper 104 to the contact 108.

The copper corrosion problem is especially severe where, such as in the device 100, there is only a small effective anode, such as the single contact 108, at which corrosion occurs. This is because the corrosion current is concentrated onto a small anodic area. The corrosion current emanates from the line of copper 104, which acts as a cathode in this process. The relatively large cathodic area of the line of copper 104 versus the relatively small anodic area of the contact 108 intensifies the corrosion 110. That is, a large amount of current emanates from the line of copper 104, owing to its large size, but this large amount of current congregates to a relatively small anodic area of the contact 108, causing substantial corrosion of the contact 108.

Therefore, there is a need for employing copper in semiconductor devices that overcomes these disadvantages. More specifically, there is a need for employing copper in a way that prevents corrosion and/or its deleterious effects. There is a need for preventing corrosion and/or its deleterious effects especially where there is only a small effective anodic area, such as where there is only a small number of contacts. For these and other reasons, there is a need for the present invention.

SUMMARY OF THE INVENTION

The invention relates to reducing metal corrosion, such as copper corrosion, in semiconductor devices. A semiconductor device includes an insulating layer, a metal line, one or more corrosive metal components, and one or more sacrificial corrosive metal components. The metal line is situated within the insulating layer. The one or more corrosive metal components are situated within the insulating layer and connected to the metal line. The one or more sacrificial corrosive metal components are situated within the insulating layer and connected to the metal line. The presence of the sacrificial components substantially reduces corrosion of the non-sacrificial components.

Embodiments of the invention provide for advantages over the prior art. The metal line acts as a cathode, whereas the corrosive metal components and the sacrificial metal components act as anodes. Corrosive current therefore flows from the cathode to the anodes. However, the sacrificial metal components substantially absorb the corrosive current emanating from the metal line. This substantially reduces, if not eliminates, corrosion of the non-sacrificial metal components. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
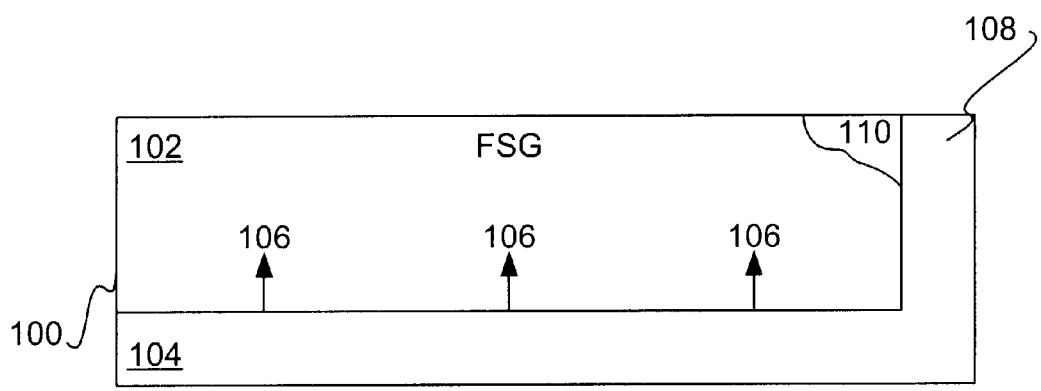
FIG. 1 is a diagram of a cross-sectional side view of a part of a semiconductor device having a copper contact that has been corroded, which can be substantially reduced or eliminated by employing an embodiment of the invention.
Figure 2:
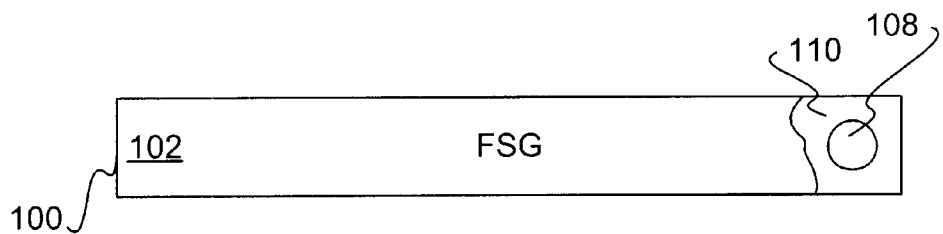
FIG. 2 is a diagram of a top view of the part of the semiconductor device of FIG. 1 of which the copper contact has been corroded, corrosion that can be substantially reduced or eliminated by employing an embodiment of the invention.
Figure 3:
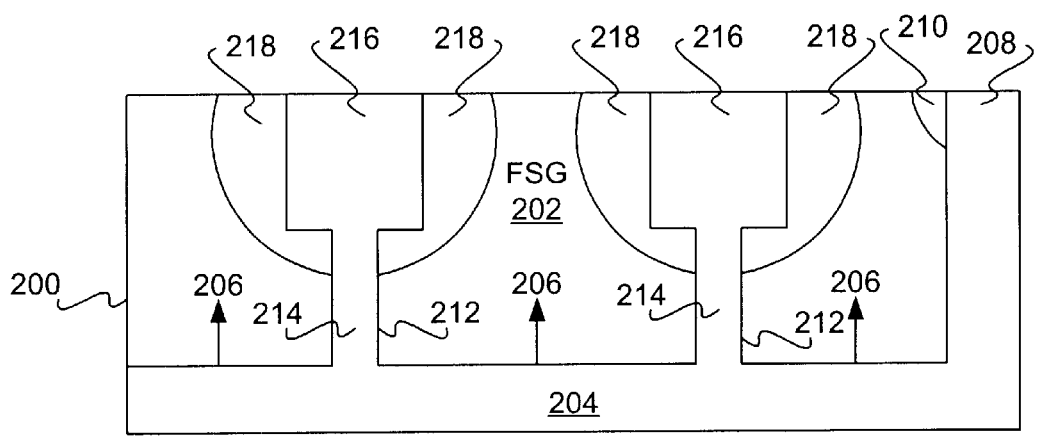
FIG. 3 is a diagram of a cross-sectional side view of a part of a semiconductor device having a copper contact and one or more sacrificial copper components that substantially reduce corrosion of the copper contact by substantially absorbing corrosive current, according to an embodiment of the invention.
Figure 4:
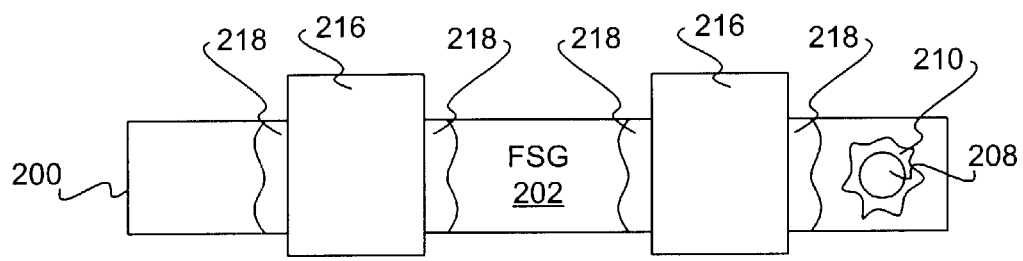
FIG. 4 is a diagram of a top view of the part of the semiconductor device of FIG. 3 of which the copper contact has substantially reduced corrosion on account of the presence of one or more sacrificial copper components, according to an embodiment of the invention.

FIGS. 3 and 4 show an example of how an embodiment of the invention substantially prevents, if not eliminates, the corrosion process with respect to an illustrative desired connection of a semiconductor device 200. FIG. 3 shows a cross-sectional side view of the device 100, whereas FIG. 4 shows a top view of the device 100. An insulating layer 202 is impregnated with a line of copper 204. The insulating layer 202 can be fluorinated silicate glass (FSG), or another type of insulating layer. The line of copper 204 is more generally a corrosive metal. The line of copper 204 rises up to form a via, a pad, or a contact 208. The contact 208 is more generally a copper component, and even more generally still a corrosive metal component. The contact 208 is a desired metal component, in that corrosion of the contact 208 is desirably substantially reduced, prevented, or eliminated. There can be more than one such desired metal component.

The line of copper 204 also connects to sacrificial copper components 212, of which there are two in FIGS. 3 and 4. There can be more or less such sacrificial metal components, and the copper components 212 are more generally corrosive metal components. Each of the components 212 has two parts in FIGS. 3 and 4: a pad 216 that is connected to the line of copper 204 via a substantially perpendicular line of metal 214, such as a copper line. The form of the sacrificial copper components 212 is not limited by the invention, and the components 212 as shown in FIGS. 3 and 4 as having pads 216 and lines 214 show an example only. Preferably, there are more in number of the sacrificial copper components 212 than the desired copper components, such as the contact 208. Furthermore, preferably the size of the pad 216 is larger than the size of the contact 208, in terms of vertical area as specifically indicated in FIG. 4.

As a result of time, or certain semiconductor fabrication processes such as chemical-mechanical polishing (CMP), electrons, represented by the arrows 206, migrate from the line of copper 204. This is because the line of copper 204 is acting as and is essentially a cathode. The electrons migrate to the sacrificial components 212, specifically the pads 216 thereof, as well as to the contact 208. This is because the pads 216 and the contacts 208 act as and are essentially anodes. This corrosive current results in the corrosion 210 around the contact 208, and the corrosive 218 around the pads 216. However, the corrosion 210 is significantly reduced as compared to the prior art, and may in fact be substantially eliminated. This is because most if not nearly all of the corrosive current emanating from the line of metal 204 flows to the pads 216. This is due to the larger size of the pads 216 relative to the contact 208, the greater number of the pads 216 relative to the contact 208, and/or for other reasons.

The presence of the sacrificial corrosive metal components 212 thus substantially reduces corrosion of the metal contact 208. That is, the anodes of the sacrificial metal components 212 substantially absorb the corrosive current emanating from the cathode of the metal line 204, substantially reducing the corrosion 210 of the anodes of the contact 208. The corrosion 218 of the pads 216 of the components 212 is substantially greater than the corrosion 210 of the contact 208. Therefore, the components 212 are sacrificial components in that they are sacrificed for the desired, non-sacrificial components, specifically the contact 208. The components 212 are themselves preferably dummy components in that they preferably serve no purpose other than to attract the corrosive current away from the (desired) contact 208. That is, the relatively large cathodic area of the line of copper 204 is neutralized by the addition of the also relatively large anodic areas of the pads 216, so that the current emanating from the cathodic area has more places to go than just to the relatively small anodic area of the contact 208.

Figure 5:
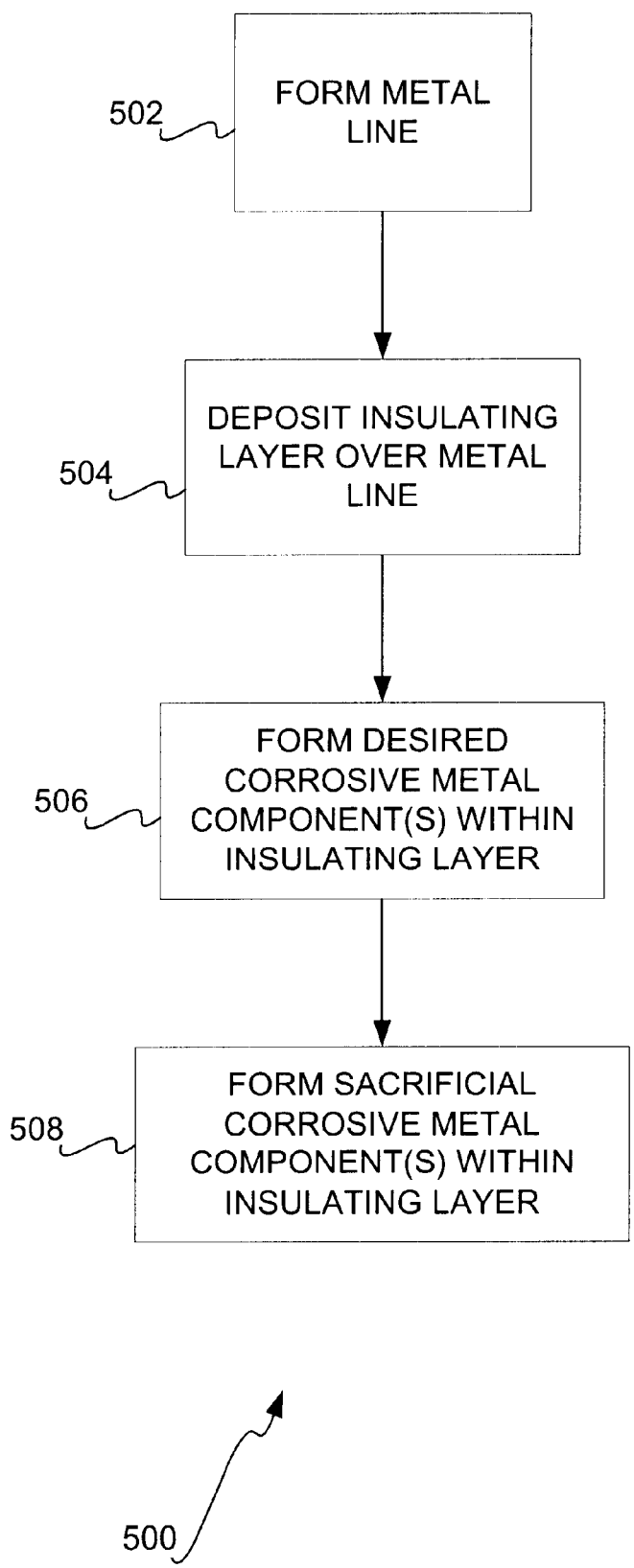
FIG. 5 is a flowchart providing an overview for fabricating a semiconductor device having one or more desired corrosive metal components and one or more sacrificial corrosive metal components, according to an embodiment of the invention, where the sacrificial components prevent the desired components from being substantially corroded.

FIG. 5 shows a method 500 that summarizes the fabrication of a semiconductor device according to an embodiment of the invention, such as the part of the device 200 shown in and described with reference to FIGS. 3 and 4. Those of ordinary skill within the art will appreciate that the actual fabrication of such a semiconductor device may employ other steps and/or acts besides those described herein, and the steps and/or acts of the method 500 described herein can be performed in varying ways. First, a metal line is formed on a semiconductor substrate of the semiconductor device (502). The metal line may be copper, or another type of metal. The metal line may be the metal line 204 of FIG. 3. An insulating layer is deposited over the metal line (504). The insulating layer may be FSG, or another type of insulating layer. The insulating layer may be the insulating layer 202 of FIGS. 3 and 4.

One or more desired, non-sacrificial corrosive metal components are then formed within the insulating layer and connected to the metal line (506). The corrosive metal may be copper, or another type of corrosive metal, where corrosive metal is metal that can corrode. The non-sacrificial components may include the contact 208 of FIGS. 3 and 4. One or more sacrificial corrosive metal components are also formed within the insulating layer and connected to the metal line (508). The corrosive metal of the sacrificial components may also be copper, or another type of corrosive metal. The sacrificial components may include the components 212 of FIG. 3. Furthermore, the sacrificial components may be the same or a different type of corrosive metal than the non-sacrificial components. The sacrificial components substantially absorb corrosive current, to substantially reduce, if not eliminate, corrosion of the desired, non-sacrificial components.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, whereas the invention has been substantially described in relation to metal that is copper, it is applicable to other types of corrosive metal as well. As another example, whereas the invention has been substantially described in relation to a sacrificial corrosive metal component having a particular form, the invention is not so limited. The invention is also not limited as to the number or size of either the sacrificial corrosive metal components or the desired, non-sacrificial corrosive metal components. Therefore, it is manifestly intended that this invention be limited only by the claims and equivalents thereof.

What is claimed is:

1. A semiconductor device comprising:
   an insulating layer;
   a metal line situated within the insulating layer;
   one or more corrodible metal components situated within the insulating layer and connected to the metal line; and,
   one or more sacrificial corrodible metal components situated within the insulating layer and connected to the metal line to substantially reduce corrosion of the one or more corrodible metal components,
   wherein the one or more sacrificial corrodible metal components outnumber the one or more corrodible metal components.

2. The device of claim 1, wherein the insulating layer comprises a fluorinated silicate glass (FSG) layer.

3. The device of claim 1, wherein the metal line is a copper line.

4. The device of claim 1, wherein each of the one or more corrodible metal components is a copper component.

5. The device of claim 1, wherein each of the one or more corrodible metal components comprises one of a via, a line, and a pad.

6. The device of claim 1, wherein the one or more corrodible metal components consists essentially of a single copper component.

7. The device of claim 1, wherein each of the one or more sacrificial corrodible metal components is a sacrificial copper component.

8. The device of claim 1, wherein each of the one or more sacrificial corrodible metal components comprises a pad connected to the metal line via another metal line.

9. The device of claim 1, wherein each of the one or more sacrificial corrodible metal components comprises a pad larger than each of the one or more corrodible metal components.

10. A semiconductor device comprising:
    an insulating layer;
    a copper line situated within the insulating layer and acting as a cathode;
    one or more copper components situated within the insulating layer, connected to the copper line, and acting as first anodes; and,
    one or more sacrificial copper components situated within the insulating layer, connected to the copper line, and acting as second anodes,
    the second anodes substantially absorbing corrosive current emanating from the cathode, substantially reducing corrosion of the first anodes.

11. The device of claim 10, wherein each of the one or more copper components comprises one of a via, a line, and a pad.

12. The device of claim 10, wherein each of the one or more sacrificial copper components comprises a pad connected to the copper line via another copper line.

13. The device of claim 10, wherein each of the one or more sacrificial copper components comprises a pad larger than each of the one or more copper components.

14. The device of claim 10, wherein the one or more sacrificial copper components outnumber the one or more copper components.

15. A method comprising:
    forming a metal line on a semiconductor substrate;
    depositing an insulating layer over the metal line;
    forming one or more corrodible metal components connected to the metal line within the insulating layer;
    forming one or more sacrificial corrodible metal components connected to the metal line within the insulating layer, the one or more sacrificial corrodible metal components substantially absorbing corrosive current to substantially reduce corrosion of the one or more corrodible metal components during a chemical-mechanical polishing (CMP) semiconductor fabrication process.

16. The method of claim 15, wherein the one or more corrodible metal components and the one or more sacrificial corrodible metal components each comprises copper.

17. The method of claim 15, wherein each of the one or more corrodible metal components comprises one of a via, a line, and a pad, and wherein each of the one or more sacrificial corrodible metal components comprises a pad connected to the metal line via another metal line.

18. The method of claim 15, wherein each of the one or more sacrificial corrodible metal components comprises a pad larger than each of the one or more corrodible metal components.

* * * * *